United States Patent [19]
Koehler

[11] 3,913,026

[45] Oct. 14, 1975

[54] MOS TRANSISTOR GAIN BLOCK

[75] Inventor: Dale R. Koehler, Westwood, N.J.

[73] Assignee: Bulova Watch Company, Inc., New York, N.Y.

[22] Filed: Apr. 8, 1974

[21] Appl. No.: 459,169

[52] U.S. Cl. .................. 330/35; 58/23 A; 307/205; 307/214; 307/304

[51] Int. Cl.$^2$ ............ H03F 3/16; H03K 3/353; H03K 19/08; H03K 19/40

[58] Field of Search ...... 307/205, 214, 304; 330/35; 58/23 A, 23 BA

[56] References Cited

UNITED STATES PATENTS

| | | | |
|---|---|---|---|
| 3,289,093 | 11/1966 | Wanlass | 307/304 X |
| 3,518,584 | 6/1970 | Miller et al. | 307/304 X |
| 3,638,047 | 1/1972 | Klein | 307/304 X |
| 3,678,407 | 7/1972 | Ahrons | 330/35 |
| 3,700,981 | 10/1972 | Masuhara et al. | 307/304 X |
| 3,761,784 | 9/1973 | Jund | 307/304 X |
| 3,775,693 | 11/1973 | Proebsting | 307/214 X |
| 3,789,246 | 1/1974 | Preisig et al. | 307/304 |
| 3,806,741 | 4/1974 | Smith | 307/304 |
| 3,823,332 | 7/1974 | Feryszka et al. | 330/35 X |

OTHER PUBLICATIONS

MacDougall et al., "Ion Implantation Offers a Bagful of Benefits for MOS," *IEEE Press*, pgs. 79–83, Edited by D. A. Hodges, 1972, Reprinted from *Electronics*, pp. 86–90, 6/22/70.

Atwood, "Field Effect Transistor Circuits," *IBM Tech. Discl. Bull.*, Vol. 6, No. 9, pp. 91–93, 2/1964.

Todd, "FETs as Voltage-Variable-Resistor," *Electronic Design*, pp. 66–68, 9/13/1965.

Jackson, "What's a MOS FET?" *Radio–Electronics*, pp. 50–51, 10/1967.

DeSimone et al., "MOSFET Sense Amplifier with Low–Input Impedance," *IBM Tech. Discl. Bull.*, Vol. 14, No. 8, pp. 2290–2291, 1/1972.

Lohman, "Applications of MOS FET's in Microelectronics," SCP and *Solid State Technology, pp. 23–29, 3/1966.*

"Field Effect Transistors," Amelco Semiconductor (division of Teledyne), Theory and Application Notes No. 2, 7 pgs., 6/1962.

*Primary Examiner*—Michael J. Lynch
*Assistant Examiner*—L. N. Anagnos

[57] ABSTRACT

An MOS gain block constituted by a pair of like MOS transistors operating in the weak inversion region and serially-connected to a low-voltage supply. One transistor acts as an active element whereby an input voltage applied to the gate produces an output voltage at the drain thereof. The other transistor whose gate is coupled to the drain of the active element, acts as a load element with respect to the active element, the stage load resistance varying to compensate for changes in the transconductance of the active element resulting from changes in supply voltage, thereby maintaining the gain of the block at a substantially constant level despite changes in supply voltage.

6 Claims, 8 Drawing Figures

BIASED AMPLIFIER BLOCK

AMPLIFIER BLOCK

BIASED AMPLIFIER BLOCK

BIASED AMPLIFIER BLOCK

BIASED AMPLIFIER BLOCK

CRYSTAL OSCILLATOR

MOS TRANSISTOR GAIN BLOCK

BACKGROUND OF THE INVENTION

This invention relates generally to MOS transistor circuits, and more particularly to an MOS gain block whose transistors operate in a weak inversion region below the usual threshold.

An MOS transistor is so named because of its construction materials; namely metal for electrical contacts, silicon dioxide acting as an electrical insulator and a semiconductor that is either of n or p-type silicon, the former having excess free electrons and the latter excess holes or vacancies in its electron shell.

A p-channel field effect MOS transistor is formed by two closely-spaced degeneratively doped p+ regioons which have been diffused into a lightly doped n-type silicon substrate, one region being the "drain" and the other the "source". A thin layer of silicon dioxide insulation is formed directly over the area separating the two diffused regions. Metal contacts, usually of aluminum, engage the drain and source whereas a "gate" electrode is positioned directly over the area between the drain and the source. The structure of an n-channel MOS transistor is similar save that n+ regions are diffused into a p-type silicon substrate. MOS transistors of the p and n-type therefore have drain, source, gate and substrate terminals.

Because of the inherent symmetry of an MOS structure, no physical distinction exists between the drain and source regions. The biasing conditions determining which region is deemed the source and which region is deemed the drain. For a p-channel MOS transistor, the p+ region with the most positive potential acts as the source, whereas the source of an n-channel transistor is the n+ region with the most negative potential. In most circuit applications, the substrate and source are kept at the same potential and are therfore tied together.

Usually p-channel MOS transistors are enhancement-type devices. That is to say, no current is caused to flow between the drain and source when a negative voltage is applied to the drain relative to the source, and the applied gate-to-source voltage is set equal to zero. Hence no conducting channel will be present at the silicon surface in the area between the two p+ diffusions at zero gate voltage, and when a negative drain-to-source voltage is imposed, no transverse current will flow through the structure because the drain junction will be reverse-biased. But if a large negative voltage is applied to the gate with reference to the source, a p-type surface inversion layer will form in the silicon directly below the gate, creating a conducting channel between the drain and the source which gives rise to an appreciable current flow between the two diffusion regions. Thus it can be seen that a p-channel enhancement-type MOS transistor will be "normally off" when the gate voltage is equal to zero and can be turned "on" with the application of a negative gate voltage.

The gate-to-source voltage required to attain surface inversion and hence conduction between the drain and source regions, is referred to as the threshold voltage of the transistor. In "normally off" enhancement-type MOS transistors, the threshold voltage is a negative value for p-channel configurations and a positive value for n-channel configurations. But n-channel MOS transistors made on lightly doped p-type silicon substrates are usually normally on with zero gate voltage. Such devices are called depletion-type because their conductance can be "depleted" by applying a gate voltage of opposite polarity to that of the drain voltage. Only the application of a negative gate-to-source voltage will turn an n-channel depletion-type MOS transistor off; hence the threshold voltage of this device will be negative. N-channel MOS transistors are often of the depletion type by reason of the existence of a positive layer of fixed charge located in the silicon dioxide near the silicon surface.

Because of its insulated gate electrode, a MOS transistor acts as a voltage-controlled device rather than as a current-amplifier like the conventional bipolar junction transistor, for the latter relies on a small base-to-emitter current to control much larger amounts of collector-to-emitter current flow. By virtue of the extremely high input impedance associated with the gate electrode of a MOS transistor, it has sometimes been treated as a solid-state analog of the vacuum-tube triode.

The main distinction between the MOS transistor and the vacuum-tube triode is that the gate electrode of the transistor modulates the conductivity of the semiconducting region between the two current-carrying electrodes (drain and source), whereas the grid of the triode establishes a retarding potential field impeding the flow of electrons traveling between cathode and anode. The three-terminal electrical characteristics of the MOS transistor are also quite different from those of the vacuum-tube triode, for when the drain current is plotted versus the applied drain-to-source voltage for varying values of gate-to-source voltage, the observed characteristics usually exhibit current saturation at values of drain voltage approximately equal to the gate voltage minus the threshold voltage.

The three-terminal characteristics of a MOS transistor falls into three distinct regions. The first region is the variable-resistance region, for at values of applied drain voltage small enough to be much less than the magnitude of the gate voltage minus the threshold voltage, the drain current at a constant gate voltage will increase linearly with the increasing drain voltage. In this region, the MOS transistor behaves like a voltage-variable resistor, with the drain-to-source resistance diminishing steadily with rising values of applied gate-to-source potential.

When the applied drain-to-source voltage is increased to a level greater than the gate voltage minus the threshold voltage, the drain current reaches saturation and becomes relatively constant and independent of drain voltage. The MOS then operates in the region of saturated-current flow. At very large values of applied drain voltage, avalanche breakdown of the drain diode occurs and the drain current then begins to rise very rapidly with increasing drain voltage, this being the avalanche breakdown region.

As noted in the article by Swanson, et al entitled "Ion-Implanted Complementary MOS Transistors In Low-Voltage Circuits" published in the IEEE Journal of Solid-State Circuits (Vol SC-7, No. 2, April, 1972), techniques have recently been developed for fabricating complementary MOS transistors with low turn-on-voltages, enabling them to be used in circuits with supply voltages less than 1.35 V.

In a complementary MOS transistor circuit, an enhancement mode n-channel transistor is connected in a series common gate configuration with an enhancement mode p-channel transistor. Since the p-channel device has a negative threshold voltage and the n-channel device has a positive threshold voltage with respect to their individual sources, a signal of O-V (logic 0) applied to the common input will simultaneously turn the p-channel transistor on and the n-channel transistor off so that the output voltage is then positive (logic 1). When the input voltage to the gates is positive (logic 1), the situation is reversed and the output voltage from the n-channel transistor is at ground (logic 0). In either of these two stable conditions, one transistor will be in a very high impedance off state - consequently the series combination of the two transistors will draw almost no steady state current.

Furthermore because of the extremely high gate input impedance associated with the MOS structure, under steady state conditions no current will flow in the gate circuit. An MOS inverter of this type will therefore dissipate virtually no power when in a stable state and power will be dissipated only when switching from one state to the other.

As pointed out in the Swanson article, in order to obtain the greatest power saving, complementary MOS logic circuits shold be operated at the lowest possible supply voltage. Because MOS transistors do not turn off abruptly but are weakly inverted at gate voltages below the threshold voltage, Swanson seeks to determine the minimum supply voltage at which the complementary circuits will operate. Swanson concludes that the fast surface state density is the most important factor in determining the performance of MOS transistors in the weak inversion region near turn-on, and that at room temperature CMOS circuits can theoretically operate at supply voltages as low as 0.2 V, provided that the fast surface state density is low enough. Ion implantation of boron is a convenient method of adjusting the turn-on voltage of MOS transistors to permit operation at low supply voltages.

There are certain factors however which come into play with CMOS transistors operating in the weak inversion region which create practical problems and represent serious disadvantages. As noted by Swanson, standard fabrication procedures using conventional clean oxide techniques yield a spread in turn-on voltages on the order of 0.2 V, so that as a practical matter the supply voltage could never be quite as low as 0.2 V. Moreover standard fabrication methods for CMOS transistors result in a fairly high rejection rate because it sometimes results in a mismatch of the characteristics of the complementary transistor pair.

Also as evidenced by the equations in the article of Swanson, the gain of a CMOS transistor circuit operating in the weak inversion region is exponentially dependent on the supply voltage. As a consequence, a small drop in the supply voltage produces a considerable reduction in gain. Inasmuch as the CMOS circuits are often battery-operated, small changes in supply voltage are often encountered in practice.

Prior attempts to render MOS transistor stages substantially independent of battery voltage have suffered from two drawbacks, for not only have the necessary circuits been relatively complicated but the power requirements therefor have been high.

SUMMARY OF THE INVENTION

In view of the foregoing, it is the main object of this invention to provide a transistor gain block of simple and low cost design entailing relatively little power and having an amplification gain which is virtually independent of the supply voltage therefor.

More particularly, it is an object of this invention to provide a gain block of the above-type constituted by a pair of serially-connected like MOS transistors operating in the weak inversion region, the block being useable with supply voltages of less than 1.35 V, so that the gain block and circuits formed therefrom may be operated from a low voltage battery, the amplfication gain being maintained despite any reduction in battery voltage in the course of operation.

Also an object of the invention is to provide solid state circuits such as inverters for logic applications, amplifiers for linear amplification, oscillators for use as frequency generators or time bases, which circuits incorporate paired MOS transistor gain blocks operating at low voltage in the weak inversion region.

Yet another object of the invention is to provide a gain block which may be manufactured by standard MOS fabrication techniques to produce a high yield with a relatively low rate of rejection as compared to CMOS devices whose requirements are more difficult to achieve.

Briefly stated these objects are attained in a gain block constituted by a pair of serially-connected like (*n* or p-type) MOS transistors operatiing in the weak inversion region, one functioning as an active element and the other as a load element. The input voltage to the block is applied to the gate of the active element to produce an output voltage at the drain thereof, which drain is connected to the gate of the load element. The supply voltage is applied to the drain of the load element with respect to the source of the active element, whereby the stage load resistance varies to compensate for changes in the transconductance of the active element as a result of changes in battery voltage thereby maintaining the gain of the stage.

OUTLINE OF THE DRAWINGS

For a better understanding of the invention as well as other objects and features thereof, reference is made to the following detailed descriptions to be read in conjunction with the accompanying drawing wherein.

DESCRIPTION OF THE INVENTION

Figure 1:
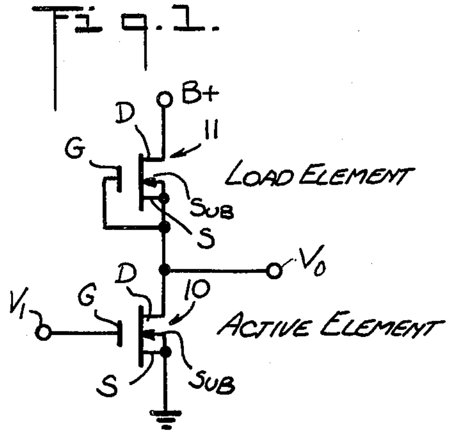
FIG. 1 is a schematic circuit diagram of a basic MOS gain block in accordance with the invention.
Figure 1A:
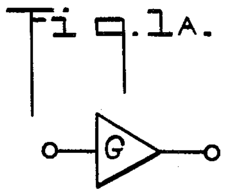
FIG. 1A is a symbolic representation thereof.

The basic gain block: Referring now to FIG. 1, there is shown the circuit of a single gain stage or block in accordance with the invention, the block being represented symbolically in FIG. 1A by amplifier G.

The block is constituted by a pair of like MOS transistors 10 and 11, each operating in the weak inversion region near turn-off in the manner described in the above-noted Swanson article whose disclosure is incorporated herein by reference. Transistors 10 and 11 are both of the n-channel enhancement type, the same type being shown in the other figures. It will be appreciated, however, that a gain block possessing similar characteristics may be obtained by means of a pair of p-channel transistors in an appropriate configuration.

Each MOS transistor is provided with a source S, a drain D, a gate G and a substrate Sub, the substrate being connected directly to the source. Transistors 10 and 11 are serially-connected with respect to a low-voltage source whose positive pole B+ is connected to the drain of transistor 11 and whose negative pole is connected to the source-substrate S-Sub of transistor 10. Gate G of transistor 11 is connected to the source-substrate S-Sub thereof and drain D of transistor 10 is connected to the source-substrate S-Sub of transistor 11.

In the gain block, transistor 10 functions as the active element serving to amplify an input voltage $V_1$ applied to gate G which yields an output voltage $V_o$ at drain D. Transistor 11 acts as a load element with respect to the amplifying active element to afford a load resistance which varies to effect compensation in a manner to be later explained.

In order to operate the MOS transistors in the weak inversion region, either of two approaches may be taken. One can, with reference to the known value of threshold voltage for the MOS transistor, lower the supply voltage so that the gate-voltage is less than the threshold voltage and thereby satisfy the criterion for operation in the weak inversion region. Alternatively, one can with a given supply voltage adjust the threshold voltage by so fabricating the MOS transistor, as by ion implantation to satisfy this criterion.

The gain of an amplifier stage is the product of its transconductance and of its load resistance. In the case of an MOS transistor stage operating in the weak inversion region of the type described in the Swanson article, it can be shown that its transconductance is proportional to current. In turn, the intensity of current is a function of supply voltage; hence a drop in this voltage produces a reduction in current and results in a change of transconductance, thereby changing the gain of the stage. Since the relationship between gain and supply voltage is exponential, a relatively small drop in this voltage results in a large loss of gain.

In the present invention, a compensatory effect is produced by the varying resistance of the stage which in large measure minimizes or effectively overcomes the dependence of stage gain on the supply voltage.

The mathematical expression for the gain of the block may be calculated by considering the current therein. We begin by requiring weak inversion operation for both transistors 10 and 11, which results in the following equation:

$$i_1 = I_2;$$

$$\frac{\beta_1}{m\gamma^2} e^{-\gamma_T V'} (i - e^{-m\gamma(B-V_o)}) = \frac{\beta_2}{\gamma^2} e^{\gamma(V_1 - V_T')} (i - e^{-m\gamma V_o}), \quad (1)$$

Where:

$\gamma = q/(nkT)$
$k$ = Boltzman's Constant
$T$ = Temperature
$q$ = electron charge
$B$ = battery voltage
$\beta_1 = \mu C_o (w/l)_1$
$\beta_2 = \mu C_o (W/L)_2$
$\mu$ = mobility
$C_o$ = gate capacitance per unit area
$V_T'$ = Threshold voltage plus $1/\gamma$
$V_o$ = drain-to-substrate voltage
$m$ = constant
$n$ = constant Rearranging the terms of equation (1), we set up the following equation:

$$e^{\gamma V} = \frac{\beta_1}{\beta_2} \left( \frac{l - e^{-m\gamma(B-V_o)}}{l - e^{-m\gamma V_o \gamma_o}} \right) \quad (2)$$

Differentiating with respect to $V_1$ and $V_o$ leads to the following expression for gain G:

$$G = \left( \frac{dV_1}{dV_o} \right)^{-1} = \frac{-1}{m} \left[ (e^{m\gamma V_o} - i)^{-1} + (e^{m\gamma(B-V_o)} - i)^{-1} \right]^{-1} \quad (3)$$

and if $e^{m\gamma V_o} >> 1$,
and $e^{\gamma V_1} \approx \beta_1/\beta_2$
then $e^{m\gamma(B-V_o)} >> 1$
with $$G \approx \frac{-1}{m} \left( \frac{\beta_1}{\beta_2} \right)^m, \; \rho V_1 = V_o.$$

The qualification set forth in equation (3) is readily met for a large range of beta ratios and from this it will be evident that gain is indeed independent of battery voltage. The absolute values of $\beta_1$ and $\beta_2$ will determine the operating current level of the gain block as well as the inherent RC response-time constant. The initial assumption of operation in the weak inversion region dictates that $V_1 \leqslant V_T'$, or conversely, having set the bias voltage, that $V_T'$, the transistor threshold voltage must be greater than $V_1 - nk\,T/q$.

HIGH IMPEDANCE VOLTAGE SOURCE

Figure 2:
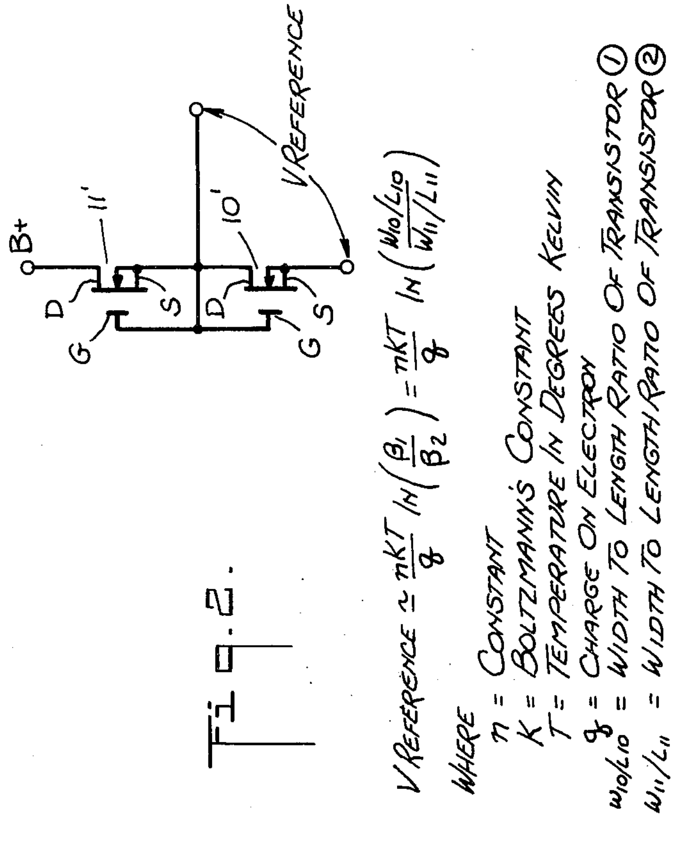
FIG. 2 is the schematic circuit of a high-impedance voltage source in accordance with the invention.

In the arrangement shown in FIG. 2, two MOS transistors 10' and 11' serially-connected and operating in the weak inversion region are arranged in a block which is identical to that shown in FIG. 1 except for the fact that the input to gate G of active transistor 10' is directly connected to drain D thereof, whereby the input and outputs are electrically tied together.

This leads to a condition where the output voltage can be adjusted by appropriate design of the sizes of the transistors to almost any value between ground and supply voltage B+, thereby creating a high impedance voltage source.

As shown by the equation in FIG. 2, the output voltage V is a function only of the basic semiconductor parameters and the geometrically designed width-to-length ratios ($W10/_{L10}$ for transistor 10' and $W11/_{L11}$ for transistor 11'), much as in the inverter analysis. An ability to exploit this application gives to the circuit designer an additional circuit element not heretofore available. The functional dependence of output voltage upon input voltage is reduced in this electrical configuration to that single value of voltage which satisfies the current characteristic of the stage and the electrical requirement $V_1 = V_o$.

FIRST BIASED GAIN BLOCK

Figure 3:
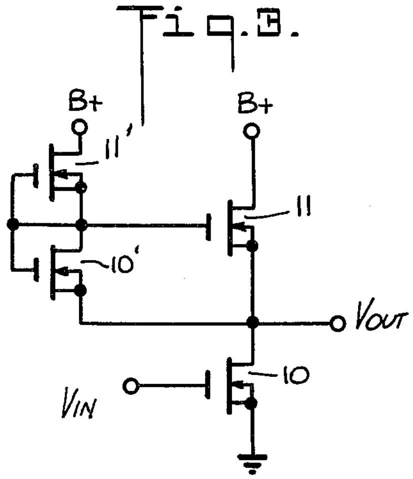
FIG. 3 is the circuit of a biased gain block incorporating said high impedance source.

Referring now to FIG. 3, there is shown a gain block amplifier of the type disclosed in connection with FIG. 1 including an active element transistor 10 and a load element transistor 11, except in this instance gate G of transistor 11 is not connected directly to the source S thereof but is coupled thereto through a high-impedance bias voltage source of the type shown in FIG. 2, composed of transistor 10' and 11'.

Thus load element 11 of the gain block is biased by the high-impedance voltage source to yield a gate-to-source voltage for the load device which is other than zero. When the gate is directly tied to the source of the load element transistor as in FIG. 1, the gate-to-source voltage is zero. This bias serves to establish the operating point of the amplifier gain block.

SECOND AND THIRD BIASED GAIN BLOCKS

Figure 4:
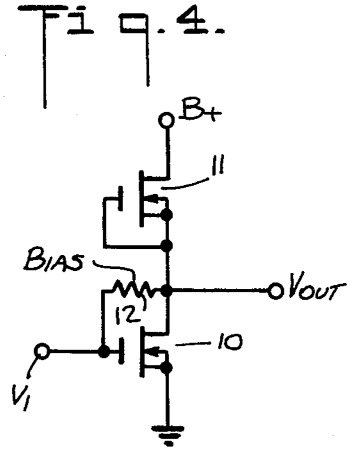
FIG. 4 is another version of a biased gain block.

In the gain block shown in FIG. 4 which is the same as that shown in FIG. 1 and includes an active element transistor 10 and a load element transistor 11, a bias voltage to fix the operating point of the amplifier is supplied by a bias resistor 12 connected between the gage G and drain D of transistor 10.

Figure 5:
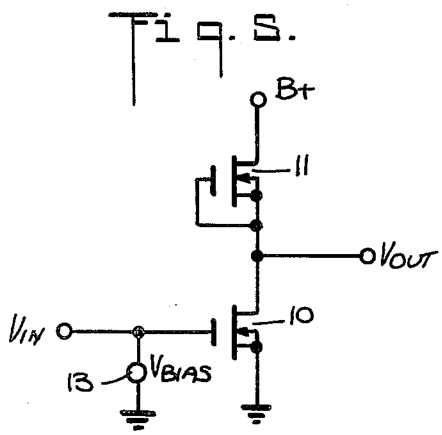
FIG. 5 is still another version of a biased gain block.

In FIG. 5, bias is applied to the active element 10 of the gain block by means of a suitable bias source 13 connected between gate and ground.

OSCILLATOR

Essentially, an oscillator consists of an amplifier whose output is positively fed back to its input to produce a regenerative action. One may use the present gain block advantageously to provide a crystal oscillator circuit constituting a stable source of oscillations to be used as a frequency standard or a time base such as in an electronic watch operating at very low battery voltage.

Figure 6:
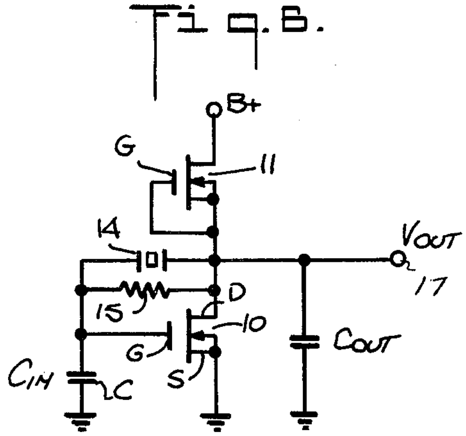
FIG. 6 is a crystal oscillator circuit which incorporates the gain block.

In the arrangement shown in FIG. 6, the positive feedback path for the active element includes a piezoelectric crystal shunted by a bias resistor 15, an input capacitor C in being connected between the gate G and ground and an output capacitor C out being connected between drain D and ground of the active element to form a Pierce oscillator circuit. The voltage established at output terminal 17 has a stable frequency determined by the crystal. In practice, other types of frequency determining elements may be used in conjunction with the gain block to provide a frequency generator.

INVERTER

Figure 7:
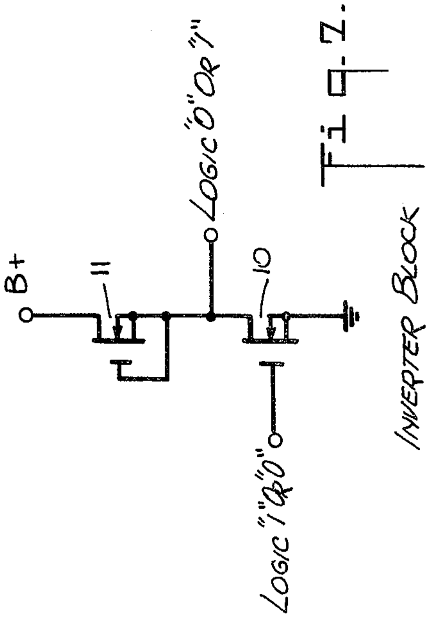
FIG. 7 is a gain block functioning as an inverter for logic applications.

As shown in FIG. 7, the basic gain block composed of active element transistor 10 and load element transistor 11 operating in the weak inversion region serves as a simple inverter to produce in response to a logic "1 " input a logic "0" output, and for a logic 0 input a logic 1 output.

The characteristics of this stage functioning as an inverter are much the same as those of the amplifier or oscillator as hereinabove described, with the additional attribute of possessing a switching point which is determined in a controllable fashion by the size of the transistors. The switching point is the voltage at which the output voltage changes from a point close to ground to a point close to battery voltage.

Since the paired transistors in the inverter gain block are of the same type, that is either both are of the n-type or of the p-type and are operating in the weak inversion region, there is no dependence on threshold voltage nor battery voltage but only upon geometrically-determined length-to-width ratios. Thus in the present invention, the inverter makes possible a controllability of switching points which is unavailable in conventional inverter designs. This advantage is accompanied by a substantial improvement in circuit yield.

MULTI-STAGE AMPLIFIER

Figure 8:
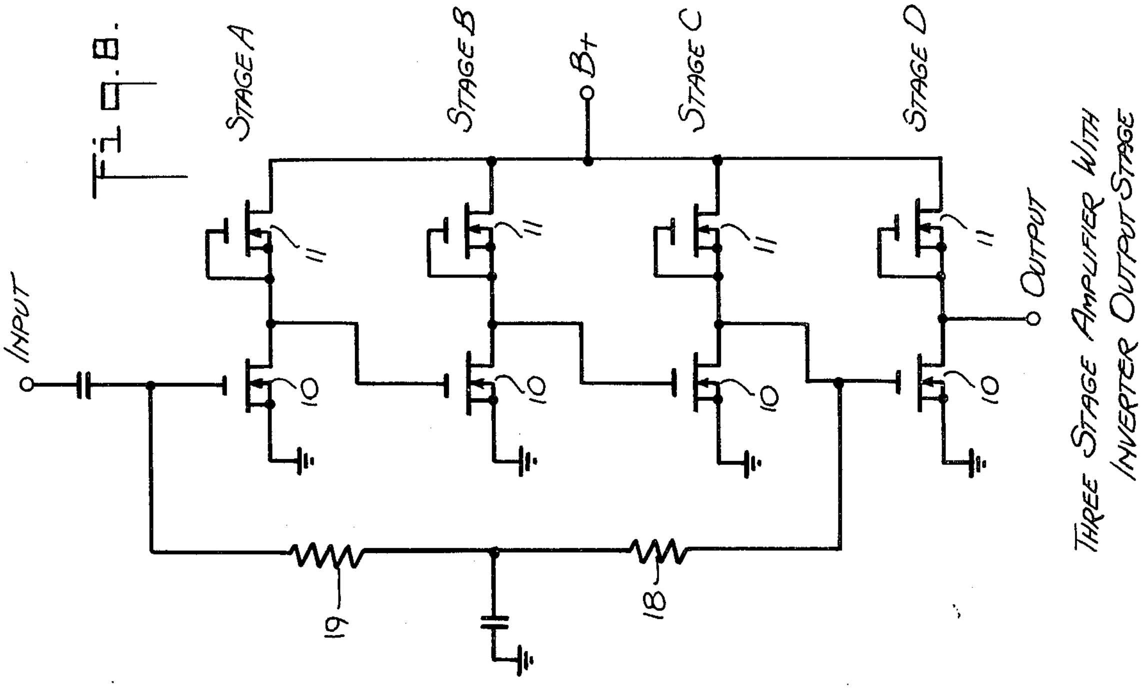
FIG. 8 is a three stage amplifier with an inverter output stage.

As shown in FIG. 8, one may connect gain blocks in accordance with the invention in cascade relation to produce a multi-stage amplifier which in the example illustrated is composed of three amplifier stages A, B and C and a final inverter stage D. Feedback and biasing is provided by resistors 18 and 19 connected between the output of stage C and the input to stage A.

All of the stages are made up of a pair of series-connected n-channel transistors, as in the basic gain block. This multi-stage amplifier not only operates at a low voltage and consumes relatively little power, but it is also substantially insensitive to changes in the supply voltage.

While there has been shown preferred embodiments of the invention, it will be appreciated that many changes and modifications may be made therein without departing from the essential spirit of the invention. Gain blocks in accordance with the invention are of particular value in the solid state electronic timepiece field which make use of miniature low voltage battery cells and integrated circuits to provide a compact, highly accurate watch. Thus in U.S. Pat. No. 3,560,998 there is disclosed an electronic timepiece using low power MOS transistor circuits, wherein both the frequency standard and the subsequent divider stages make use of complementary MOS transistor circuits. These circuits may be advantageously replaced by MOS gain blocks in accordance with the invention operating in the weak inversion region, the resultant system then being substantially independent of the battery voltage.

I claim:

1. A solid-state gain block comprising:

A. a pair of like MOS transistors of the enhancement-mode type, each having a source, a drain, a substrate and a gate, the substrate being connected to the source, one of said transistors functioning as an active amplifying element and the other as a variable resistance load element;

B. means connecting the drain of the active element to the source of the load element, thereby connecting said elements in series with respect to the voltage of a supply applied between the drain of the load element and the source of the active element;

C. means to apply an input voltage to the gate of the active element and to derive an output voltage from the drain thereof; and D. means coupling the gate of the load element to the drain of the active element, said enhancement-mode transistors being operated in their weak inversion region whereby a change in said supply voltage gives rise to a variation in the stage load resistance to a degree compensating for the resultant change in the transconductance of the active element, thereby maintaining the gain of the block despite said change in supply voltage.

2. A block as set forth in claim 1 wherein said transistors are of the n-channel type.

3. A block as set forth in claim 1, wherein said transistors are of the p-channel type.

4. A gain block as set forth in claim 1, further including means providing a high impedance voltage source at its output and to the gate of said load element comprising third and fourth transistors constituting a second pair of like MOS transistors of the enhancement-mode type;

means connecting the drain of said third transistor to the respective voltage supply terminal connected to the drain of said load element, the gate and source of said third transistor are commonly connected and also connected to the gate of said load element;

means connecting the source of said fourth transistor to the source of said load element and to the drain of said active element, the respective gate and drain of said fourth transistor are connected in common and to the gate of said load element, whereby said fourth transistor constitutes said coupling means.

5. A block as set forth in claim 1, further including a resistor connected between the gate of the active element and the drain thereof to impose a bias on said active element to set the operating point of the block.

6. A gain block as set forth in claim 1, wherein said input voltage is constituted by logic values 0 and 1 and the resultant output voltage is constituted by inverted logic values 1 and 0.

* * * * *

UNITED STATES PATENT OFFICE
CERTIFICATE OF CORRECTION

PATENT NO. : 3,913,026

DATED : October 14, 1975

INVENTOR(S) : Dale R. Koehler

It is certified that error appears in the above-identified patent and that said Letters Patent are hereby corrected as shown below:

Column 1, line 15 "regioons" should have read -- regions --

Column 5, line 62 " $\frac{\beta_1}{m\gamma^2} e^{-\gamma T V'}$ "

should have read -- $\frac{\beta_1}{m\gamma^2} e^{-\gamma V T'}$ --

Column 5, line 66 " $\frac{\beta_2}{\gamma^2} e$ "

should have read -- $\frac{\beta_2}{m\gamma^2} e$ --

Column 6, line 20 " $e^{\gamma V} = \frac{\beta_1}{\beta_2}\left(\frac{1-e^{-m\gamma(B-V_0)}}{1-e^{-m\gamma V_0 \gamma_0}}\right)$ ".

should have read -- $e^{\gamma V_1} = \frac{\beta_1}{\beta_2}\left(\frac{1-e^{-m\gamma(B-V_0)}}{1-e^{-m\gamma V_0}}\right)$ --

Column 6, line 41 " $, PV_1 = V_0$ "

should have read -- IF $V_1 = V_0$ --

Signed and Sealed this

*thirtieth* Day of *December 1975*

[SEAL]

*Attest:*

RUTH C. MASON
*Attesting Officer*

C. MARSHALL DANN
*Commissioner of Patents and Trademarks*